(12) United States Patent
Helm et al.

(10) Patent No.: US 9,202,536 B2
(45) Date of Patent: Dec. 1, 2015

(54) THREE DIMENSIONAL MEMORY CONTROL CIRCUITRY

(75) Inventors: Mark Helm, Santa Cruz, CA (US); Jung Sheng Hoei, Fremont, CA (US); Aaron Yip, Santa Clara, CA (US); Dzung Nguyen, Freemont, CA (US)

(73) Assignee: Intel Corporation, Santa Clara, CA (US)

( * ) Notice: Subject to any disclaimer, the term of this patent is extended or adjusted under 35 U.S.C. 154(b) by 7 days.

(21) Appl. No.: 13/995,044

(22) PCT Filed: Mar. 26, 2012

(86) PCT No.: PCT/US2012/030632
§ 371 (c)(1),
(2), (4) Date: Sep. 6, 2013

(87) PCT Pub. No.: WO2013/147743
PCT Pub. Date: Oct. 3, 2013

(65) Prior Publication Data
US 2014/0146612 A1 May 29, 2014

(51) Int. Cl.
| *G11C 16/04* | (2006.01) |
| *G11C 7/12* | (2006.01) |
| *G11C 7/18* | (2006.01) |
| *G11C 8/14* | (2006.01) |
| *H01L 27/02* | (2006.01) |
| *H01L 27/06* | (2006.01) |
| *H01L 27/105* | (2006.01) |

(Continued)

(52) U.S. Cl.
CPC *G11C 7/12* (2013.01); *G11C 5/025* (2013.01); *G11C 5/12* (2013.01); *G11C 7/18* (2013.01); *G11C 8/14* (2013.01); *G11C 13/0002* (2013.01); *G11C 13/0004* (2013.01); *G11C 13/0023* (2013.01); *G11C 16/24* (2013.01); *H01L 27/0207* (2013.01); *H01L 27/0688* (2013.01); *H01L 27/1052* (2013.01); *H01L 27/11526* (2013.01); *H01L 27/11529* (2013.01); *H01L 27/11556* (2013.01); *H01L 27/11573* (2013.01); *H01L 27/11582* (2013.01); *Y10T 29/49155* (2015.01)

(58) Field of Classification Search
USPC .............................. 365/63, 185.11
See application file for complete search history.

(56) References Cited

U.S. PATENT DOCUMENTS

| 2002/0126524 A1* | 9/2002 | Sugibayashi et al. ......... 365/158 |
| 2008/0310220 A1* | 12/2008 | Tan et al. ...................... 365/182 |

(Continued)

FOREIGN PATENT DOCUMENTS

KR 2009-0072399 A 7/2009

OTHER PUBLICATIONS

Johnson, et al., "512-Mb PROM with a Three-Dimensional Array of Diode/Antifuse Memory Cells", IEEE Journal of Solid-State Circuits, vol. 38, No. 11, Nov. 2003, pp. 1920-1928.

(Continued)

*Primary Examiner* — Hoai V Ho
(74) *Attorney, Agent, or Firm* — Alpine Technology Law Group LLC

(57) ABSTRACT

An integrated circuit includes a memory array, a wordline circuit, divided into at least two subcircuits, to control the memory array, and a bitline circuit, divided into at least two subcircuits, to control the memory array. The wordline subcircuits and the bitline subcircuits at least partially overlap separate respective regions of the memory array.

17 Claims, 6 Drawing Sheets

(51) Int. Cl.
*H01L 27/115* (2006.01)
*G11C 5/02* (2006.01)
*G11C 5/12* (2006.01)
*G11C 13/00* (2006.01)
*G11C 16/24* (2006.01)

(56) References Cited

U.S. PATENT DOCUMENTS

| | | | |
|---|---|---|---|
| 2009/0086525 A1 | 4/2009 | Park et al. | |
| 2009/0141532 A1 | 6/2009 | Nagashima et al. | |
| 2010/0054019 A1* | 3/2010 | Toda | 365/148 |
| 2010/0265749 A1 | 10/2010 | Wang et al. | |
| 2011/0286261 A1 | 11/2011 | Sakaguchi et al. | |
| 2012/0057405 A1* | 3/2012 | Ogiwara et al. | 365/185.11 |
| 2013/0148411 A1* | 6/2013 | Atsumi et al. | 365/149 |
| 2014/0085979 A1* | 3/2014 | Kono | 365/185.11 |

OTHER PUBLICATIONS

International Search Report and Written opinion for PCT Patent Application No. PCT/US2012/030632, mailed on Nov. 30, 2012, 9 Pages.

International Preliminary Report on Patentability received for PCT application PCT/US2012/030632 mailed on Oct. 9, 2014.

* cited by examiner

THREE DIMENSIONAL MEMORY CONTROL CIRCUITRY

BACKGROUND

1. Technical Field

The present subject matter relates generally to semiconductor memory devices. More specifically, the present subject matter relates to memory devices having a three-dimensional design.

2. Background Art

Semiconductor memory devices can include blocks of memory cells in a larger integrated circuit or stand-alone integrated circuits. While traditional memory devices build the cells in a two dimensional array, some devices may build a three dimensional array of cells. In some three dimensional flash memories, a NAND string may be built vertically, stacking the individual field-effect transistors (FETs) of the string on top of each other, so that the string extends out from the substrate. Such architectures may provide for very high bit densities in a flash memory device.

Support circuitry, such as line drivers, sense amplifiers, address decoders and other such circuitry may still be built using more traditional layout techniques using areas of the substrate that are not covered by the memory array. While the support circuitry may have multiple layers of material, such as doped silicon, polysilicon, metal, silicon-oxide, or other materials, such designs may still be referred to as having a two-dimensional layout, as they generally do not have active devices stacked on top of each other, like the three-dimensional memory array.

BRIEF DESCRIPTION OF THE DRAWINGS

The accompanying drawings, which are incorporated in and constitute part of the specification, illustrate various embodiments. Together with the general description, the drawings serve to explain various principles. In the drawings.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification.

Reference now is made in detail to the examples illustrated in the accompanying drawings and discussed below.

Figure 1A:
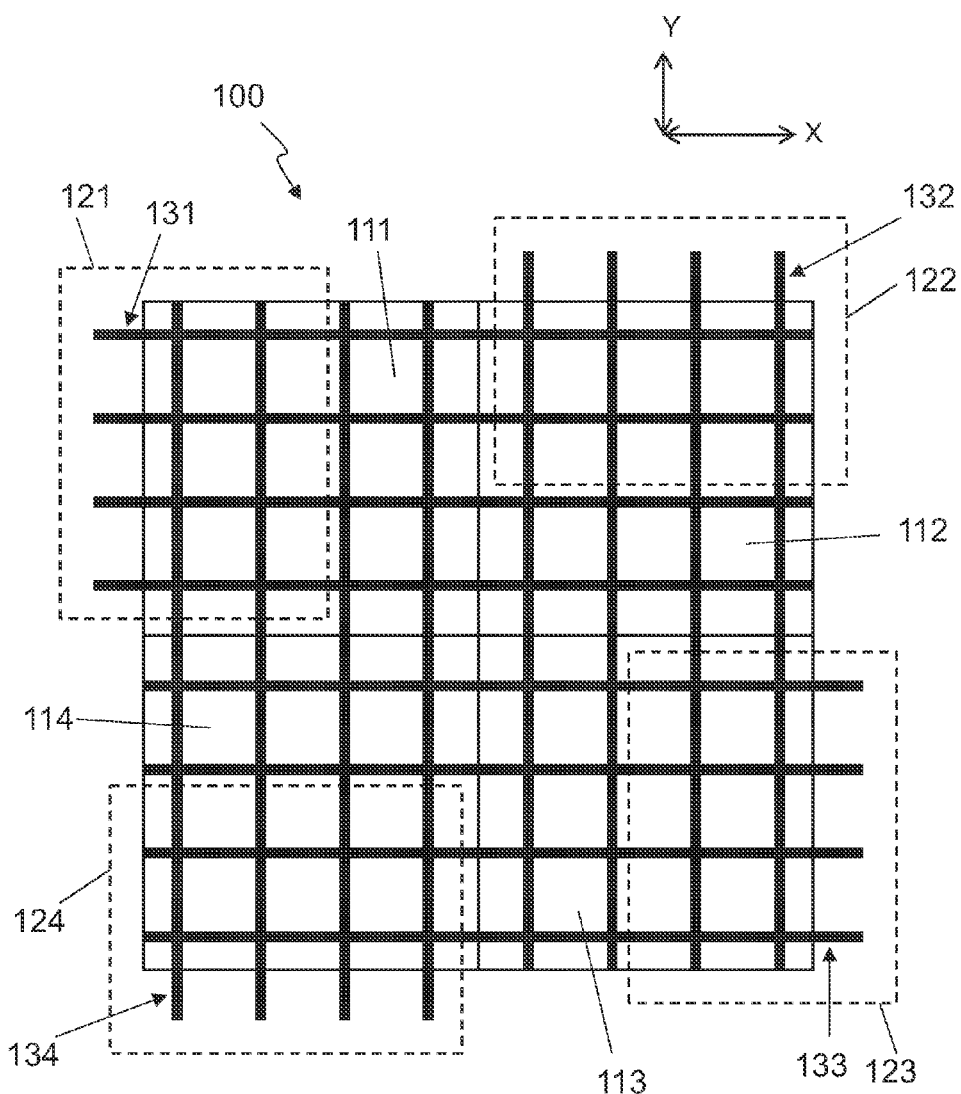
FIGS. 1A and 1B depict block diagrams of a top view of a memory array with control circuitry underneath the memory array.

FIG. 1 depicts a block diagram of a top view of a memory array 100 with control circuitry 121-124 underneath the memory array 100. The memory array 100 may be a part of a memory device or some other type of integrated circuit. The memory array 100 may be built using three-dimensional (3D) circuitry so that memory cells are built on top of the substrate. Such 3D circuit techniques may use the substrate as a mechanical base for the memory array without using the substrate itself for the circuitry of the memory array. Various types of memory may utilize such techniques, including, but not limited to, floating gate flash memory, charge-trap flash memory, phase-change memory, phase change memory with switch, resistive memory, and ovonic memory. Any memory technology capable of being constructed on top of control circuitry may be used, including emerging technologies such as ferroelectric transistor random access memory (Fe-TRAM), nanowire technology, or other future technologies. One type of memory that uses 3D techniques is stacked NAND flash, which stacks multiple floating gate or charge-trap flash memory cells in a vertical stack wired in a NAND fashion. An array 100 may then be created using the stacks. Various other types of memory may use various other organizations for the memory array 100.

A memory device includes various additional circuitry in addition to the memory array 100. The circuitry may include address decoders, line drivers, sense amplifiers, charge-pumps, state machines, or various other types of circuitry. In a traditional chip floorplan, the additional circuitry is positioned beside the memory array 100 on a memory chip, which makes the die size of the memory chip larger than the array 100. If traditional two-dimensional (2D) layout is used, there is no alternative to this and many designs using 3D techniques continue to use a similar floorplan. But if the memory array 100 does not use the substrate for circuitry of the array, it may be possible to use the area under the memory array 100 for at least some of the additional circuitry, even if the memory array 100 is a 2D memory array.

Traditional floorplans often have at least some of the additional circuitry directly beside the array, on two adjacent sides, giving access to control lines running through the array in both the "x-axis" direction and the "y-axis" direction. These control lines may be referred to by various names, but some of the control lines may commonly be called word lines and bit lines in some designs, where the word lines may be perpendicular to the bit lines. Some floorplans have the additional circuitry on all four sides of the array, where the circuitry on one side couples to some of the control lines that may be accessible on its respective side of the array and the circuitry on the opposite side of the array couples to the rest of the control lines routed in that direction.

In some early 3D memory designs, attempts have been made to move at least some of the additional circuitry under the 3D memory array. But if circuitry on adjacent sides of the array are both moved under the array, a conflict arises for the space in the corner of the array. This is due to the fact that to line up with the pitch of the array, it may be desirable to line the circuitry up with the rows and columns of the array, which puts the circuit coupled to the bit line of the corner memory cell in the same position as desirable for the circuit coupled to the word line of that same corner memory cell. To avoid this issue, some designs may have placed the circuitry from one side, or opposite sides, of the array under the array, but left the circuitry on the adjacent sides outside of the array footprint.

The memory array 100 of FIG. 1 avoids such problems by splitting the additional circuitry into four sections 121, 122, 123, 124, but unlike the traditional floorplans using all four sides of the array, the various sections couple to a spatially segregated set of control lines. The memory array 100 is split into four quadrants, 111, 112, 113, 114 arranged so that a quadrant is adjacent to two other quadrants and positioned diagonally from the remaining quadrant. The quadrants may be thought of as being numbered in a counter-clockwise fashion or in a clockwise fashion, as shown, where the first quadrant 111 is to the left of the second quadrant 112 and above the fourth quadrant 114, while positioned diagonally from the third quadrant 113. The quadrants 111-114 may be of different sizes or may be the same size in various embodiments. In some embodiments, the four quadrants 111-114 may not be exactly lined up and may have a certain amount of offset from their neighboring quadrants.

The control lines may be divided into four sets as well. A first set of control lines 131 that cross the array 100 in an "x" direction are coupled to the first quadrant 111 and the second quadrant 112 of the memory array 100. A second set of control lines 132 that cross the array 100 in a "y" direction are coupled to the second quadrant 112 and the third quadrant 113 of the memory array 100. A third set of control lines 133 that cross the array 100 in an "x" direction are coupled to the third quadrant 113 and the fourth quadrant 114 of the memory array 100. And a fourth set of control lines 134 that cross the array 100 in a "y" direction are coupled to the fourth quadrant 114 and the first quadrant 111 of the memory array 100. In some embodiments, the first set of control lines 131 and the third set of control lines 133 may be word lines and the second set of control lines 132 and the fourth set of control lines 134 may be bit lines. In some embodiments, additional control lines, such as source gate control lines and drain gate control lines or other control lines, may be included in the various sets of control lines 131-134.

In various embodiments, the first set of control lines 131 and the third set of control lines 133 may be substantially parallel to each other. By being substantially parallel, the various control lines over their length, ignoring local bends or curves in the control lines, may transit in substantially the same direction, or within about +/−15° of the same overall direction. The second set of control lines 132 and the fourth set of control lines 134 may also be substantially parallel to each other, and also may be substantially perpendicular to the first set of control lines 131 and the third set of control lines 133.

Four control circuits 121-124 may be at least partially positioned under respective quadrants 111-114 of the memory array 100. Four sets of control lines 131-134 are coupled to respective control circuits 121-124, respective quadrants 111-114 of the memory array 100 and a quadrant adjacent to the respective quadrant 111-114 of the memory array 100. The control lines 131-134 coupled to the control circuits 121-124 under opposite quadrants 111-114 are substantially parallel, but the control lines 131-134 coupled to the control circuits 121-124 under adjacent quadrants 111-114 are substantially perpendicular.

In the embodiment, shown, a first control circuit 121 is coupled to the first set of control lines 131, a second control circuit 122 is coupled to the second set of control lines 132, a third control circuit 123 is coupled to the third set of control lines 133, and a fourth control circuit 124 is coupled to the fourth set of control lines 134. The first control circuit 121 may be any type of circuit to support the memory array 100. In various embodiments, the first control circuit 121 may include address decoders, line drivers, sense amplifiers, charge-pumps, state machines, or various other types of circuitry. The other control circuits 122-124 may include similar circuitry as the first control circuit 121 or may have different circuitry. In some embodiments, the first control circuit 121 and the third control circuit 123 may perform a similar function for the two halves of the memory array 100 and may have similar circuitry. In such embodiments, the second control circuit 122 and the fourth control circuit 124 may perform a similar function for a different two halves of the memory array 100 that may be different than the function performed by the first control circuit 121 and the third control circuit 123. The second control circuit 122 and fourth control circuit 124 may have similar circuitry to each other that is different than the circuitry of the first control circuit 121 and the third control circuit 123 in such embodiments.

The control circuits 121-124 may be positioned so that only a portion of the control circuit is under the memory array 100 in some embodiments, but in other embodiments, the control circuits 121-124 may be fully under the memory array 100. Any amount of the control circuitry, from 1% to 100%, may be positioned under the respective quadrant of memory. In some embodiments, a majority of the control circuit 121 is under the first quadrant 111 of the memory array 100 meaning that over 50% of the die area covered by the first control circuit 121 is also covered by the first quadrant 131 of the memory array 100. In at least one embodiment more than 80% of the first control circuit 121 is covered by the first quadrant 111 of the memory array 100. The other control circuits 122-124 may be covered similarly by their respective quadrant 112-114 of the memory array 100.

The memory array 100 may be a 2D array of memory cells or a 3D array of memory cells, and the memory cells may be any type of memory, including, but not limited to, floating gate flash memory cells, charge-trap flash memory cells, phase-change memory cells, resistive memory cells, and ovonic memory cells. The memory cells may be organized in any fashion including, but not limited to, NAND strings, NOR structures, and full random access structures.

Figure 1B:
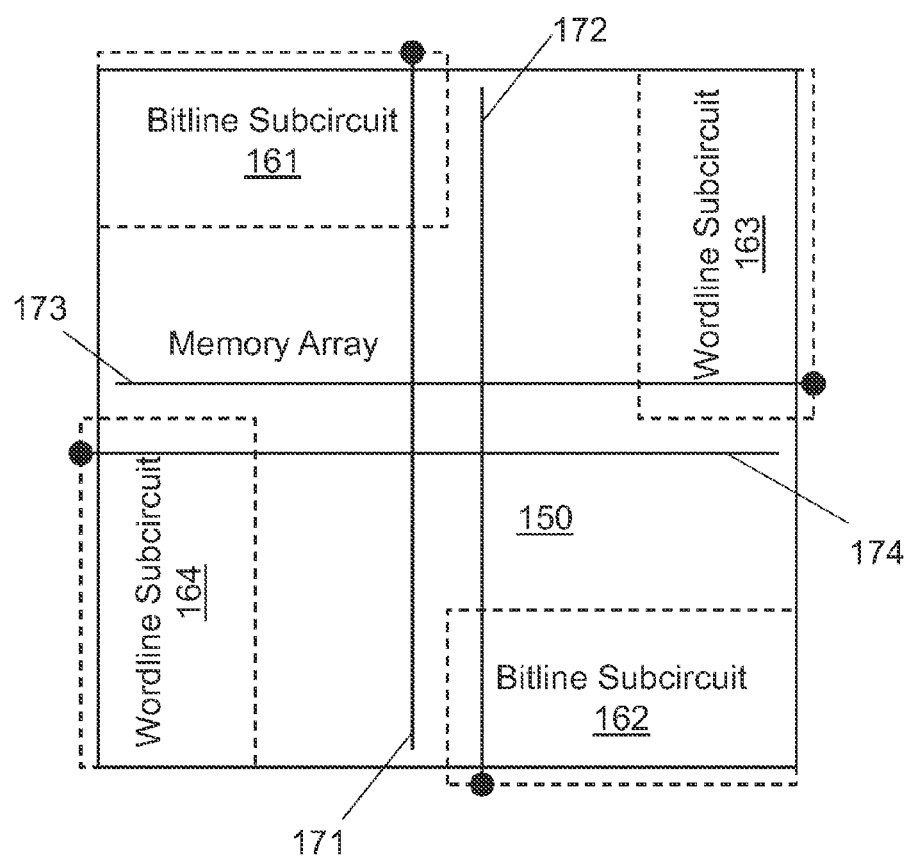

FIG. 1B depicts a block diagram of a top view of a memory array 150 with control circuitry 161-164 overlapping the memory array 150, which may be a three dimensional array of memory cells or a two dimensional array of memory cells, depending on the embodiment. Overlap may mean that the footprint of the control circuitry 161-164 on the substrate may have some common area with the footprint of the memory array 150 projected onto the substrate. A bitline circuit is divided into at least two subcircuits, bitline subcircuit 161 and bitline subcircuit 162, to control the memory array. The bitline subcircuit 161 may drive a subset of the bit lines, including bit line 171, across the memory array 150, and the bitline subcircuit 162 may drive other bit lines, including bit line 172, across the memory array 150. A wordline circuit is divided into at least two subcircuits, wordline subcircuit 163 and wordline subcircuit 164, to control the memory array. The wordline subcircuit 163 may drive a subset of the word lines, including word line 173, across the memory array 150, and the wordline subcircuit 164 may drive other word lines, including word line 174, across the memory array 150. The word lines may be substantially perpendicular to the bit lines.

The bitline subcircuits 161, 162 and the wordline subcircuits 163, 164 at least partially overlap separate respective regions of the memory array. Bitline subcircuit 161 may overlap the upper left quadrant of the memory array 150 while bitline subcircuit 162 may overlap the lower right quadrant of the memory array 150. Wordline subcircuit 163 may overlap the upper right quadrant of the memory array 150 while wordline subcircuit 162 may overlap the lower left quadrant of the memory array 150. In such embodiments, the bitline subcircuits 161, 162 may overlap opposing corners of the memory array 150, and the at least two wordline subcircuits 163, 164 may overlap different opposing corners of the memory array 150. In some embodiments, the bitline subcircuits 161, 162 and/or wordline subcircuits 163, 164 may be constructed on top of the memory array 150 using three dimensional circuitry, but in other embodiments, the bitline the bitline subcircuits 161, 162 and/or wordline subcircuits 163, 164 may be at least partially formed in the substrate of the integrated circuit, with the memory array 150 situated external to the substrate, so that the wordline subcircuits 163, 164 are underneath opposing corners of the memory array 150, and the bitline subcircuits 161, 162 are underneath different opposing corners of the memory array 150. The word corner may not refer to the exact outermost vertex of the memory array, but may refer to the general area near the vertex.

Figure 2:
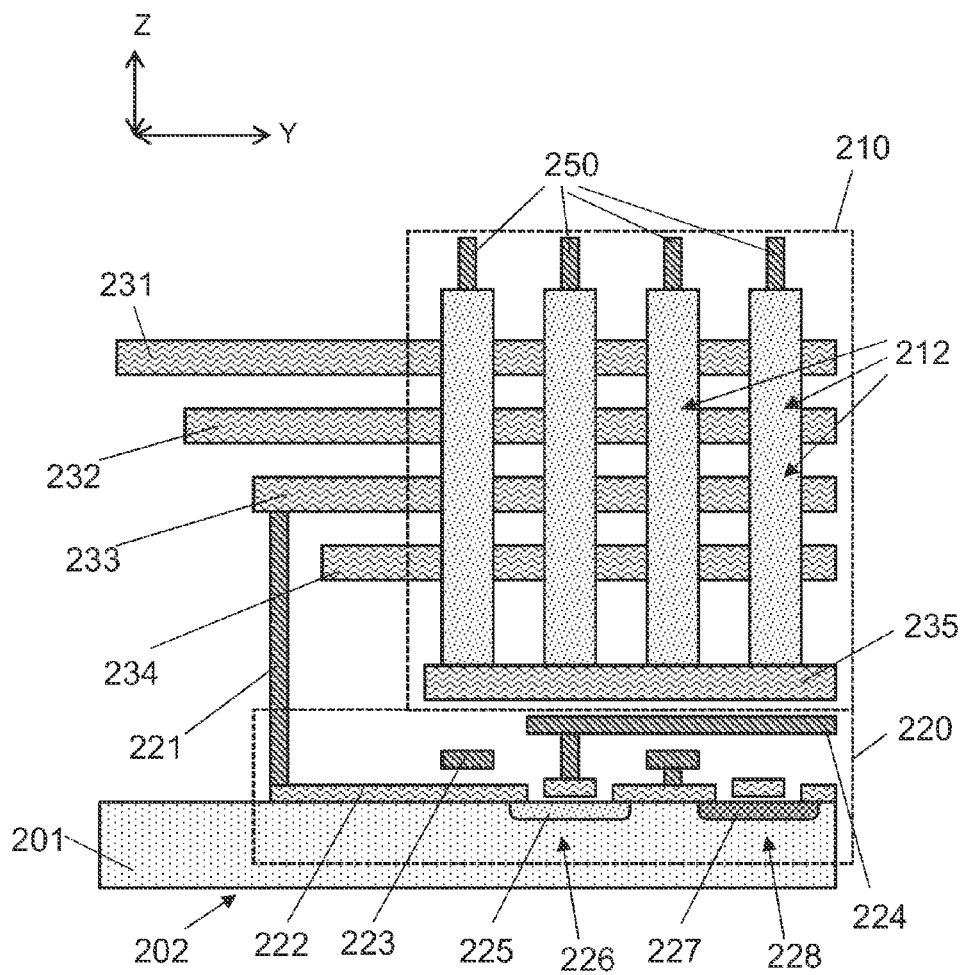
FIG. 2 is a cross-sectional side view of a portion of a three-dimensional memory array with control circuitry underneath the memory array.

FIG. 2 is a cross-sectional side view of a portion of a three-dimensional memory array 210 with control circuitry 220 underneath the memory array 210. In the embodiment shown, the memory array 210 is an edge portion of one quadrant of a 3D stacked NAND flash array with four NAND stacks shown. The four NAND stacks are coupled to bit lines 250 that travel in the "x" dimension, or into and out of the page in FIG. 2. Each stack is coupled to a drain control line 231, a first word line 232, a second word line 233, a source control line 234, and a source line 235, to provide for two bits of storage per stack. Memory cells 212, only some of which are labeled, are created at the points where the word lines 232, 233 couple to the towers of doped polysilicon. The un-hatched areas in FIG. 2 may be filled with an insulating material, such as silicon-oxide.

A control circuit 220 built on the substrate 201 is positioned below the memory array 210. In this disclosure and associated claims, a portion of the control circuit 220 is considered below, beneath, under, or underneath the memory array 210 if an imaginary line could be drawn perpendicular to the back surface 202 of the substrate 201 that goes through a portion of the control circuit 220 and a portion of the memory array 210, and the portion of the control circuit 220 is between the back surface 202 of the substrate 201 and the portion of the memory array 210 on the imaginary line.

The control circuit 220 may include transistors 226, 228. In some embodiments, both n-channel 225 metal-oxide semiconductor field-effect transistors (MOSFET) 226, and p-channel 227 MOSFETs 228 may be included. The control circuitry 220 may include two or more layers of interconnect such as the polysilicon interconnect layer 222, the first metal interconnect layer 223 and the second metal interconnect layer 224. Various embodiments may include any number of interconnect layers and some embodiments may have multiple layers of active devices, such as MOSFETs, as well. The control lines, such as the second word line 233 may be coupled to the control circuit 220 using vias, such as via 221 to allow electrical communication between the control circuit 220 and the control lines 231-235. The bit lines 250 may be coupled to a different control circuit positioned under a different portion of the memory array.

Figure 3:
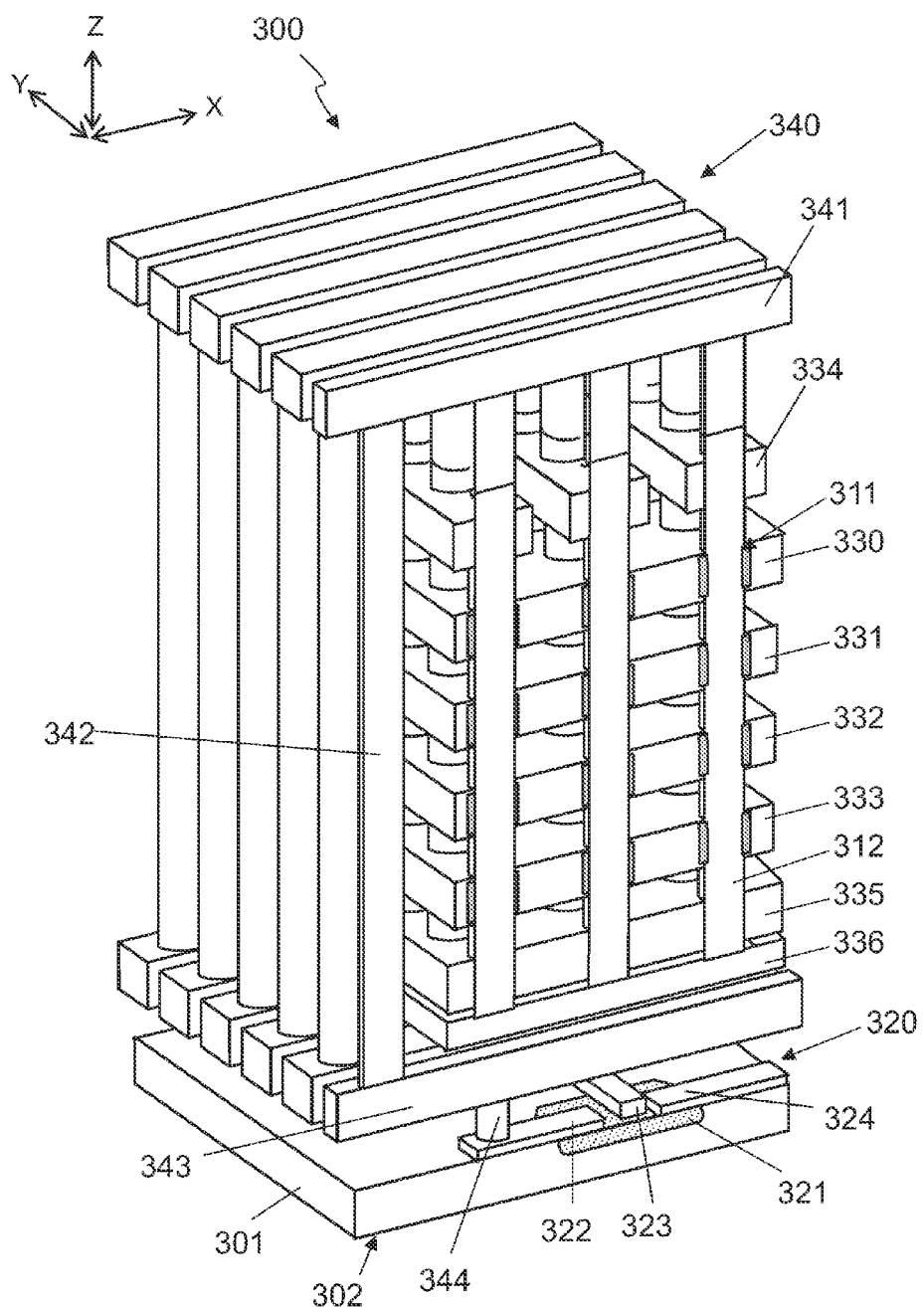
FIG. 3 is an isometric view of a portion of a three-dimensional memory array with control circuitry underneath the memory array.

FIG. 3 is an isometric view of a portion of a three-dimensional memory array 300 with control circuitry 320 underneath the memory array 300. In the embodiment shown, the memory array 300 is built with vertical NAND flash memory cells. A small portion of the vertical NAND memory 300, 4×6 stacks of 4 memory cells, is shown. Various embodiments may have any number of stacks of memory cells, with many embodiments including many millions, or even billions, of stacks of memory cells. A stack may have two or more memory cells, with some embodiments having 4, 8, 16, or 32 memory cells in a stack, although any number of memory cells may be included in a stack, including numbers that are not a power of two. In some embodiments, a single bit may be stored in an individual memory cell, but other embodiments may store multiple bits of information in a single memory cell by controlling the amount of charge stored in the charge storage region of an individual memory cell. For clarity, regions of the vertical NAND memory 300 that may be filled with an insulating material are transparent in FIG. 3, allowing the structural detail to be exposed.

The vertical NAND memory 300 is built on a substrate 301 with a back surface 302 and having a thickness in the Z dimension and extending in the X and Y dimensions much farther than its Z dimension. Control circuitry 320 may be created in or on the substrate 301. The control circuitry 320 may be any type of circuitry including address decoders, line drivers, sense amplifiers, or any other type of circuitry. In the embodiment of FIG. 3, a MOSFET is shown as an exemplary portion of the control circuit 320, including a doped silicon well 321, a source 322, a gate 323 and a drain 324. The source may be coupled to interconnect 343 by via 344.

Stacks of memory cells are built on top of the control circuitry 320, The memory cells are positioned higher on the z-axis than the control circuitry 320, with the origin of the z-axis at the back surface 302 of the substrate 301. The stacks of memory cells include four memory cells per stack in the embodiment shown. One stack of memory cells, which is typical for the other stacks, includes a silicon body 312 that is coupled to a source line 336 at its bottom and a bit line 341 at its top. A source control line 335 controls a source control gate and a drain control line 334 controls a drain control gate. The first memory cell 311 may have a polysilicon control gate that is word line 0, 330. The second memory cell may have a polysilicon control gate that is word line 1, 331. The third memory cell may have a polysilicon control gate that is word line 2, 332, and the fourth memory cell may have a polysilicon control gate that is word line 3, 333. The memory cells have respective charge storage regions, which in this embodiment may be a floating gate that is located between the respective word line and the body 312. Additional groups of NAND strings may be coupled to different control lines and/or bit lines.

Various embodiments may have any number of source lines, bit lines, source control lines, drain control lines, word lines, or other control lines. The portion of the memory array 300 shown is an edge of one quadrant of the memory array 300. The bit lines 340 traverse the portion of the memory array 300 in the "x" dimension as shown and exit the array 300 on the left side of FIG. 3. The word lines 330-333, drain control lines 334, and source control line 335 traverse the portion of the memory array 300 in the "y" direction and may exit the array at a different quadrant and be coupled to a different control circuit that is located beneath that quadrant of the memory array 300. The bit line 341 is coupled to the interconnect 343 by via 342 so that the control circuit 320 is coupled to a control line, or bit line 341, that is coupled to at least a portion of the memory array 300. The bit lines 340, including bit line 341, may continue to another quadrant of the memory array 300 where the bit line 341 may be coupled to additional stacks of memory cells.

Figure 4:
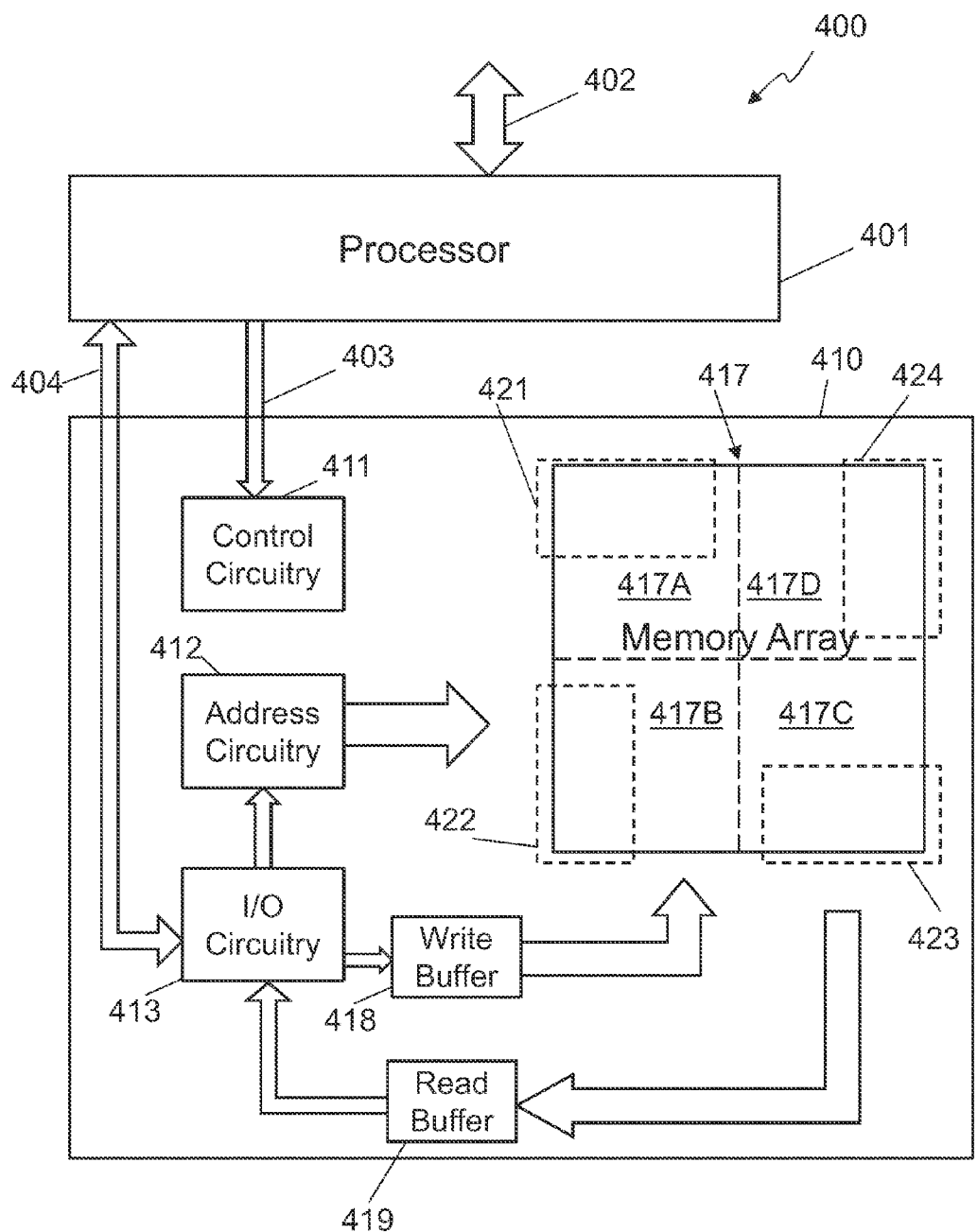
FIG. 4 is a block diagram of an embodiment of an electronic system.

FIG. 4 is a block diagram of an embodiment of an electronic system 400. Many different embodiments of the electronic system 400 are possible other than the embodiment shown, including using a single processor 401 to control multiple memory devices 410 to provide for more storage space, multiple processors 401 connected to memory devices 410, and systems including a variety of other functionality.

The processor 401 may be coupled to the memory device 410 with control lines 403 and data lines 404. In some embodiments data and control may utilize the same lines. The processor 401 may be an external microprocessor, microcontroller, or some other type of external controlling circuitry. In some embodiments, the processor 401 may be integrated in the same package or even on the same die as the memory device 410. In some embodiments, the processor 401 may be integrated with the control circuitry 411, allowing some of the same circuitry to be used for both functions. The processor 401 may have external memory, such as RAM and ROM, used for program storage and intermediate data or it may have internal RAM or ROM. In some embodiments, the processor may use the memory device 410 for program or data storage. A program running on the processor 401 may implement many different functions including, but not limited to, a standard file system, a flash file system, write leveling, bad cell or block mapping, network communication stacks, and error management. The storage system 400 has been simplified to focus on features of the memory that are helpful in understanding this disclosure.

In some embodiments an external connection 402 is provided. The external connection 402 is coupled to the processor 401 and allows the processor 401 to communicate to external devices. The processor 401 may receive write commands and write data through the external connection and store the write data in the memory device. The processor 401 may also receive read commands from the external connection, retrieve read data from the at least one memory device, and send the read data through the external connections. If the electronic system 400 is a storage system, the external connection 402 may be used to provide an external device with non-volatile storage. The electronic system 400 may be a solid-state drive (SSD), a USB thumb drive, or any other type of storage system. The external connection 402 may be used to connect to a computer or other intelligent device such as a cell phone or digital camera using a standard or proprietary communication protocol. Examples of computer communication protocols that the external connection may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express.

If the electronic system 400 is a computing system, such as a mobile telephone, a tablet, a notebook computer, a set-top box, or some other type of computing system, the external connection 402 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)-Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

The memory device 410 includes an array 417 of memory cells, such as the memory arrays illustrated previously in FIG. 1-3. The memory array 417 may be arranged into quadrants with word line rows and bit line columns. A first set of bit lines may be coupled to a first quadrant 417A and a second quadrant 417B and a second set of bit lines may be coupled to the third quadrant 417C and the fourth quadrant 417D. A first set of word lines may be coupled to the first quadrant 417A and the fourth quadrant 417D and a second set of word lines may be coupled to the second quadrant 417B and the third quadrant 417C.

A first control circuit 421 may be coupled to the first set of bit lines and a third control circuit 423 may be coupled to the second set of bit lines. A fourth control circuit 424 may be coupled to first set of word lines and the second control circuit 422 may be coupled to the second set of word lines. The first control circuit 421 may be positioned at least partially under the first quadrant 417A of the memory array 417. The second control circuit 422 may be positioned at least partially under the second quadrant 417B of the memory array 417. The third control circuit 423 may be positioned at least partially under the third quadrant 417C of the memory array 417. The fourth control circuit 424 may be positioned at least partially under the fourth quadrant 417D of the memory array 417.

Address buffer circuitry 412 may be provided to latch address signals provided through the I/O circuitry 413. Address signals may be received and decoded by a combination of the address buffer circuitry 412 and the control circuits 421-424. It may be appreciated by those skilled in the art, with the benefit of the present description that the number of address input connections depends on the density and architecture of the memory array 417. That is, the number of addresses increases with both increased memory cell counts and increased bank and block counts.

The memory device 410 may read data in the memory array 417 by sensing voltage or current changes in the memory array columns using sense amplifier circuitry in the first control circuit 421 and the third control circuit 423. The sense amplifier circuitry, in one embodiment, is coupled to read and latch a row of data from the memory array 417 and communicate with the read buffer 419 which may hold data read from the memory array 417 until it can be sent out through the data lines 404. Write buffers 418 may be used in some embodiments to accumulate data until a write can be performed and the data communicated to the first control circuit 421 and the third control circuit 423. The I/O circuitry 413 routes the data through the I/O pins of the memory device 410. In some embodiments, the write buffer 418 and/or the read buffer 419 may be included in the first control circuit 421 and the third control circuit 423.

Memory control circuitry 411 may decode commands provided on control lines 403 from the processor 401. These commands are used to control the operations on the memory array 417, including data read, data write (program), and erase operations. The memory controller circuitry 411 may be a state machine, a sequencer, a processor, or some other type of controller to generate the voltage waveforms necessary to control the memory array 417. The control circuitry 411 communicates with the other blocks in the memory device but those connections are not shown as they would overly complicate the block diagram 400 and one skilled in the art can understand that the control circuitry 411 has numerous interconnections with the other blocks in order to control their functions. In some embodiments, the memory control circuitry 411 may be positioned below the memory array 417 or may be distributed among the control circuits 421-424.

Figure 5:
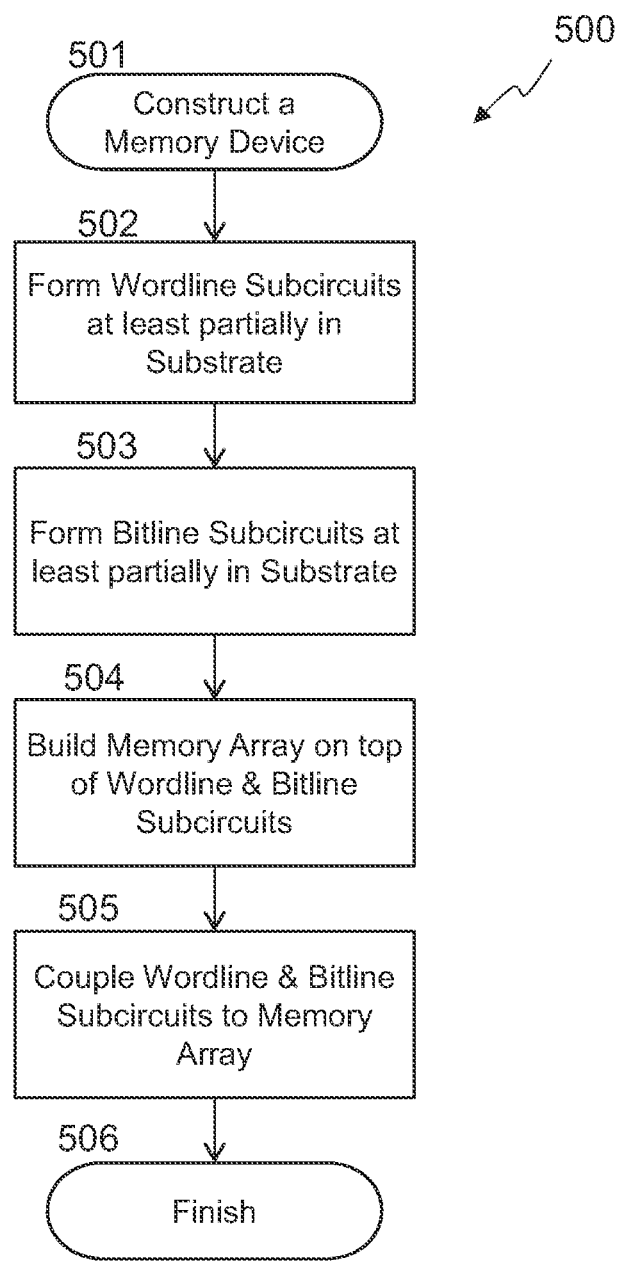
FIG. 5 is a flow chart of a method of constructing a memory device.

FIG. 5 is a flow chart 500 of a method of constructing a memory device. Any type and number of semiconductor processing techniques may be used for the various aspects of the method, including, but not limited to, lithography, chemical vapor deposition (CVD), ion implantation, mechanical etching, chemical etching, or any other process. The method may begin to construct a memory device a block 501. At block 502 a wordline circuit that is divided into two subcircuits is formed at least partially in the substrate of the memory device. The wordline circuitry may include field-effect transistors (FETs) that may include channels or other features that are built into the substrate, such as diffused regions of silicon. At block 503 a bitline circuit that is divided into two subcircuits is formed at least partially in the substrate of the memory device. The wordline subcircuits and the bitline subcircuits may be positioned in and/or on the substrate in a pattern similar to that shown in FIG. 1B.

An array of memory cells may be built at block 504 on top of the control circuits. The memory array may be a 2D array or a 3D array, depending on the embodiment. The memory array is built so that the two wordline subcircuits are at least partially underneath opposite quadrants of the memory array, and the two bitline subcircuits are at least partially underneath other opposite quadrants of the memory array, such as shown in FIG. 1B. In some embodiments, a majority of respective areas of the two wordline subcircuits and the two bitline subcircuits are underneath the memory array.

The wordline subcircuits and the bitline subcircuits may be coupled to the memory array at block 505. A first set of word lines may be coupled to the first wordline subcircuit, the first quadrant of the memory array, and the second quadrant of the memory array. A second set of word lines may be coupled to the second wordline subcircuit, the third quadrant of the memory array, and the fourth quadrant of the memory array. A first set of bit lines may be coupled to the first bitline subcircuit, the second quadrant of the memory array, and the third quadrant of the memory array. And a second set of bit lines may be coupled to the second bitline subcircuit, the fourth quadrant of the memory array, and the first quadrant of the memory array. In some embodiments, the word lines are substantially perpendicular to the bit lines. The acts described by blocks 504-505 can be performed in any order or may be performed simultaneously. In some embodiments blocks 504-505 may even be partially performed simultaneously with blocks 502 and 503 and/or other acts. The method may finish any necessary remaining tasks and end at block 506.

Examples of various embodiments are described in the following paragraphs:

An example integrated circuit (IC) includes a memory array, a wordline circuit, divided into at least two subcircuits, to control the memory array, and a bitline circuit, divided into at least two subcircuits, to control the memory array. In the example IC the wordline subcircuits and the bitline subcircuits at least partially overlap separate respective regions of the memory array. In some example ICs, the at least two wordline subcircuits may be underneath opposing corners of the memory array, and the at least two bitline subcircuits may be underneath different opposing corners of the memory array. In some example ICs, the memory array may include floating gate flash memory cells, charge-trap flash memory cells, phase-change memory cells, resistive memory cells, or ovonic memory cells. In some example ICs, the memory array may include a three-dimensional array of memory cells. Some example ICs include a substrate, and the memory array may be situated external to the substrate with the first control circuit at least partially formed in the substrate. In some example ICs, a majority of the respective areas of the at least two wordline subcircuits and the at least two bitline subcircuits may be positioned beneath the memory array. In some example ICs, the wordline circuit may be coupled to the memory array by word lines and the bitline circuit maybe coupled to the memory array by bit lines, and the word lines may be substantially perpendicular to the bit lines. Any combination of the examples of this paragraph may be used in embodiments.

Another example integrated circuit (IC) includes a memory array and a first control circuit positioned at least partially under a first quadrant of the memory array. A first set of control lines is coupled to the first control circuit, the first quadrant of the memory array, and a second quadrant of the memory array. A second control circuit is positioned at least partially under the second quadrant of the memory array and a second set of control lines is coupled to the second control circuit, the second quadrant of the memory array, and a third quadrant of the memory array. In some examples of the IC the first set of control lines may be substantially perpendicular to the second set of control lines. In some examples of the IC the memory array, memory cells may be floating gate flash memory cells, charge-trap flash memory cells, phase-change memory cells, resistive memory cells, or ovonic memory cells. In some examples of the IC the memory array may be a three-dimensional array of memory cells. In some examples of the IC the first control circuit may include line driver circuitry. In some examples of the IC the second control circuit may include sense amplifier circuitry. In some examples of the IC a majority of the first control circuit may be positioned under the first quadrant of the memory array. Some examples of the IC may include a third control circuit positioned at least partially under the third quadrant of the memory array with a third set of control lines coupled to the third control circuit, the third quadrant of the memory array, and a fourth quadrant of the memory array. Some examples of the IC may include a fourth control circuit positioned at least partially under the fourth quadrant of the memory array and a fourth set of control lines coupled to the fourth control circuit, the fourth quadrant of the memory array, and the first quadrant of the memory array. In some examples of the IC the first set of control lines may be substantially parallel to the third set of control lines, and substantially perpendicular to the second and fourth sets of control lines. Some examples of the IC may include a substrate, wherein the memory array is disposed external to the substrate and the first control circuit is at least partially formed in the substrate. Any combination of the examples of this paragraph may be used in embodiments.

Another example integrated circuit (IC) includes a memory array having four quadrants, four control circuits at least partially positioned under respective quadrants of the memory array, and four sets of control lines coupled to the respective control circuits, the respective quadrants of the memory array and a quadrant adjacent to the respective quadrant of the memory array. In the example method, the control lines coupled to control circuits under opposite quadrants are substantially parallel, and the control lines coupled to control circuits under adjacent quadrants are substantially perpendicular. In some examples of the IC the memory cells may be floating gate flash memory cells, charge-trap flash memory cells, phase-change memory cells, resistive memory cells, or ovonic memory cells. In some examples of the IC the memory array may include a three-dimensional array of memory cells. In some examples of the IC at least one control circuit may include line driver circuitry. In some examples of the IC at least one control circuit comprises may include sense amplifier circuitry. In some examples of the IC a majority of the respective control circuits may be positioned under the respective quadrants of the memory array. In some examples of the IC the four quadrants of the memory array may include a first quadrant, a second quadrant, a third quadrant and a fourth quadrant with the first quadrant is adjacent to the second quadrant, adjacent to the fourth quadrant and opposite the third quadrant. In some examples of the IC the four control circuits may include a first control circuit positioned at least partially under the first quadrant, a second control circuit positioned at least partially under the second quadrant, a third control circuit positioned at least partially under the third quadrant and a fourth control circuit positioned at least partially under the fourth quadrant. In some example ICs the four sets of control lines may include a first set of control lines coupled to the first control circuit, the first quadrant, and the second quadrant, a second set of control lines coupled to the second control circuit, the second quadrant, and the third quadrant, a third set of control lines coupled to the third control circuit, the third quadrant, and the fourth quadrant, and a fourth set of control lines coupled to the fourth control circuit, the fourth quadrant, and the first quadrant. In some examples of the IC the first and third sets of control lines may be word lines and the first control circuit and third control circuit may include word line drivers. In some examples of the IC the second and fourth sets of control lines may be bit lines and the second control circuit and the fourth control circuit may include sense amplifiers. Any combination of the examples of this paragraph may be used in embodiments.

An example electronic system may include a processor to generate memory control commands, and at least one memory circuit, coupled to the processor, to respond to the memory control commands. The example at least one memory circuit includes a memory array and a first control circuit positioned at least partially under a first section of the memory array with a first set of control lines coupled to the first control circuit, the first section of the memory array, and a second section of the memory array. The example at least one memory circuit also includes a second control circuit positioned at least partially under the second section of the memory array with a second set of control lines coupled to the second control circuit, the second section of the memory array, and a third section of the memory array. In some examples of the electronic system the first set of control lines may be substantially perpendicular to the second set of control lines. In some examples of the electronic system the memory cells may be floating gate flash memory cells, charge-trap flash memory cells, phase-change memory cells, resistive memory cells, or ovonic memory cells. In some examples of the electronic system the memory array may include a three-dimensional array of memory cells. In some examples of the electronic system the second control circuit may include line driver circuitry. In some examples of the electronic system the first control circuit may include sense amplifier circuitry. In some examples of the electronic system a majority of the first control circuit may be positioned under the first section of the memory array. In some examples of the electronic system the at least one memory circuit may include a third control circuit positioned at least partially under the third section of the memory array with a third set of control lines coupled to the third control circuit, the third section of the memory array, and a fourth section of the memory array, and a fourth control circuit positioned at least partially under the fourth section of the memory array with a fourth set of control lines coupled to the fourth control circuit, the fourth section of the memory array, and the first section of the memory array. In some examples of the electronic system the first set of control lines may be substantially parallel to the third set of control lines, and substantially perpendicular to the second and fourth sets of control lines. Any combination of the examples of this paragraph may be used in embodiments.

Another example electronic system may include a processor to generate memory control commands, and at least one memory circuit, coupled to the processor, to respond to the memory control commands. The example at least one memory circuit includes a memory array and a wordline circuit, divided into at least two subcircuits, to control the memory array, and a bitline circuit, divided into at least two subcircuits, to control the memory array. In the example electronic system the wordline subcircuits and the bitline subcircuits at least partially overlap separate respective regions of the memory array. In some example electronic systems, the at least two wordline subcircuits may be underneath opposing quadrants of the memory array, and the at least two bitline subcircuits may be underneath different opposing quadrants of the memory array. In some example electronic systems, the memory array may include floating gate flash memory cells, charge-trap flash memory cells, phase-change memory cells, resistive memory cells, or ovonic memory cells. In some example electronic systems, the memory array may include a three-dimensional array of memory cells. Some example electronic systems include a substrate, and the memory array may be situated external to the substrate with the first control circuit at least partially formed in the substrate. In some example electronic systems, a majority of the respective areas of the at least two wordline subcircuits and the at least two bitline subcircuits may be positioned beneath the memory array. In some example electronic systems, the wordline circuit may be coupled to the memory array by word lines and the bitline circuit maybe coupled to the memory array by bit lines, and the word lines may be substantially perpendicular to the bit lines. Any combination of the examples of this paragraph may be used in embodiments.

An example method of constructing a memory device may include creating a first, second, third and fourth control circuit on a semiconductor substrate and building an array of memory cells having a first, second, third and fourth quadrant so at least a portion of the respective control circuits are beneath respective quadrants of the array of memory cells. The example method also includes coupling a first set control lines to the first control circuit, the first quadrant of the array, and the second quadrant of the array, coupling a second set control lines to the second control circuit, the second quadrant of the array, and the third quadrant of the array, coupling a third set control lines to the third control circuit, the third quadrant of the array, and the fourth quadrant of the array, and coupling a fourth set control lines to the fourth control circuit, the fourth quadrant of the array, and the first quadrant of the array. In some examples of the method the array may include a three-dimensional array of memory cells. In some examples of the method a majority of the area of the respective control circuits may be positioned beneath the respective quadrants of the memory array. In some examples of the method the first set of control lines may be substantially parallel to the third set of control lines, and substantially perpendicular to the second and fourth sets of control lines. Any combination of the examples of this paragraph may be used in embodiments.

An example method of constructing a memory device includes forming a wordline circuit and a bitline circuit at least partially in a substrate of the memory device, with the wordline circuit divided into at least two subcircuits and the bitline circuit divided into at least two subcircuits. The example method also includes building a memory array so that the at least two wordline subcircuits are at least partially underneath opposite quadrants of the memory array, and the at least two bitline subcircuits are at least partially underneath other opposite quadrants of the memory array. In some example methods, the memory array may include a three-dimensional array of memory cells. In some example methods, a majority of respective areas of the at least two wordline subcircuits and the at least two bitline subcircuits may be underneath the memory array. Some example methods may also include coupling a first set of word lines to a first wordline subcircuit, a first quadrant of the memory array, and a second quadrant of the memory array, coupling a second set of word lines to a second wordline subcircuit, a third quadrant of the memory array, and a fourth quadrant of the memory array, coupling a first set of bit lines to a first bitline subcircuit, the second quadrant of the memory array, and the third quadrant of the memory array, and coupling a second set of bit lines to a second bitline subcircuit, the fourth quadrant of the memory array, and the first quadrant of the memory array. Any combination of the examples of this paragraph may be used in embodiments.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. An integrated circuit, comprising:
   a substrate having a back surface extending in an X dimension and a Y dimension;
   a three-dimensional memory array comprising vertical NAND memory cells extending in a Z direction from the back surface of the substrate; and
   a control circuit built on the substrate and positioned below at least portions of the three-dimensional memory array, the control circuit comprising:
   a wordline circuit, divided into at least two subcircuits, to control the memory array; and
   a bitline circuit, divided into at least two subcircuits, to control the memory array;
   wherein the wordline subcircuits and the bitline subcircuits at least partially overlap separate respective regions of the memory array.

2. The integrated circuit of claim 1, wherein the at least two wordline subcircuits are underneath opposing corners of the memory array, and the at least two bitline subcircuits are underneath different opposing corners of the memory array.

3. The integrated circuit of claim 1, wherein the memory array comprises memory cells selected from a group consisting of floating gate flash memory cells, charge-trap flash memory cells, phase-change memory cells, resistive memory cells, and ovonic memory cells.

4. The integrated circuit of claim 1, wherein the three-dimensional memory array of vertical NAND memory cells comprises:
   a silicon body coupled to a source line at a bottom portion thereof and to a bit line at a top portion thereof;
   a source control line to control a source control gate; and
   a drain control line to control a drain control gate.

5. The integrated circuit of claim 4, wherein:
   the three dimensional memory array comprises a number, N, of vertical NAND memory cells, wherein each of the vertical NAND memory cells is coupled to a word line.

6. The integrated circuit of claim 1, wherein a majority of the respective areas of the at least two wordline subcircuits and the at least two bitline subcircuits are positioned beneath the memory array.

7. The integrated circuit of claim 1, wherein the wordline circuit is coupled to the memory array by word lines and the bitline circuit is coupled to the memory array by bit lines, and the word lines are substantially perpendicular to the bit lines.

8. An electronic system comprising:
   a processor to generate memory control commands;
   a substrate having a back surface extending in an X dimension and a Y dimension;
   a three-dimensional memory array comprising vertical NAND memory cells extending in a Z direction from the back surface of the substrate; and
   a control circuit built on the substrate and positioned below at least portions of the three-dimensional memory array, the control circuit comprising:
   a wordline circuit, divided into at least two subcircuits, to control the memory array; and
   a bitline circuit, divided into at least two subcircuits, to control the memory array;
   wherein the wordline subcircuits and the bitline subcircuits at least partially overlap separate respective regions of the memory array.

9. The electronic system of claim 8, wherein the at least two wordline subcircuits are underneath opposing quadrants of the memory array, and the at least two bitline subcircuits are underneath different opposing quadrants of the memory array.

10. The electronic system of claim 8, wherein the memory array comprises memory cells selected from a group consisting of floating gate flash memory cells, charge-trap flash memory cells, phase-change memory cells, resistive memory cells, and ovonic memory cells.

11. The electronic system of claim 8, wherein the three-dimensional memory array of vertical NAND memory cells comprises:
   a silicon body coupled to a source line at a bottom portion thereof and to a bit line at a top portion thereof;
   a source control line to control a source control gate; and
   a drain control line to control a drain control gate.

12. The electronic system of claim 11, wherein:
   the three dimensional memory array comprises a number, N, of vertical NAND memory cells, wherein each of the vertical NAND memory cells is coupled to a word line.

13. The electronic system of claim 8, wherein the wordline circuit is coupled to the memory array by word lines and the bitline circuit is coupled to the memory array by bit lines, and the word lines are substantially perpendicular to the bit lines.

14. A method of constructing a memory device, the method comprising:
   forming a wordline circuit and a bitline circuit at least partially in a substrate of the memory device, the substrate having a back surface extending in an X dimension and a Y dimension, wherein the wordline circuit is divided into at least two subcircuits and the bitline circuit is divided into at least two subcircuits; and building a three-dimensional memory array comprising vertical NAND memory cells extending in a Z direction from the back surface of the substrate;

coupling the memory array to a control circuit built on the substrate and positioned below at least portions of the three-dimensional memory array so that the at least two wordline subcircuits are at least partially underneath opposite quadrants of the memory array, and the at least two bitline subcircuits are at least partially underneath other opposite quadrants of the memory array.

15. The method of claim 14, wherein the three-dimensional memory array of vertical NAND memory cells comprises:

a silicon body coupled to a source line at a bottom portion thereof and to a bit line at a top portion thereof;

a source control line to control a source control gate; and a drain control line to control a drain control gate.

16. The method of claim 4, wherein:

the three dimensional memory array comprises a number, N, of vertical NAND memory cells, wherein each of the vertical NAND memory cells is coupled to a word line.

17. The method of claim 14, further comprising:

coupling a first set of word lines to a first wordline subcircuit, a first quadrant of the memory array, and a second quadrant of the memory array;

coupling a second set of word lines to a second wordline subcircuit, a third quadrant of the memory array, and a fourth quadrant of the memory array;

coupling a first set of bit lines to a first bitline subcircuit, the second quadrant of the memory array, and the third quadrant of the memory array; and coupling a second set of bit lines to a second bitline subcircuit, the fourth quadrant of the memory array, and the first quadrant of the memory array.

* * * * *